(12) United States Patent
Chung

(10) Patent No.: US 6,955,961 B1
(45) Date of Patent: Oct. 18, 2005

(54) METHOD FOR DEFINING A MINIMUM PITCH IN AN INTEGRATED CIRCUIT BEYOND PHOTOLITHOGRAPHIC RESOLUTION

(75) Inventor: Henry Chung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 2 days.

(21) Appl. No.: 10/854,801

(22) Filed: May 27, 2004

(51) Int. Cl.$^7$ .......................................... H01L 21/8242
(52) U.S. Cl. ...................................... 438/241; 438/947
(58) Field of Search ................................ 438/241, 275, 438/401, 947, 950, 952

(56) References Cited

U.S. PATENT DOCUMENTS 5,328,810 A * 7/1994 Lowrey et al. ............. 430/313
5,595,941 A * 1/1997 Okamoto et al. ............. 216/46
5,618,383 A * 4/1997 Randall ....................... 430/314
6,835,662 B1 * 12/2004 Erhardt et al. .............. 438/689

* cited by examiner

Primary Examiner—Chandra Chaudhari
(74) Attorney, Agent, or Firm—Rabin & Berdo, P.C.

(57) ABSTRACT

A method for defining a minimum pitch in an integrated circuit beyond photolithographic resolution controls the defined pitches of the target layer by use of polymer spacer, photo-insensitive polymer plug and polymer mask during the process, so as to achieve the minimum pitch of the target layer beyond photolithographic resolution. Applied to memory manufacture, this method is capable of simultaneously overcoming the process difficulty of significant difference between polysilicon pitches in memory array region and periphery region.

63 Claims, 10 Drawing Sheets

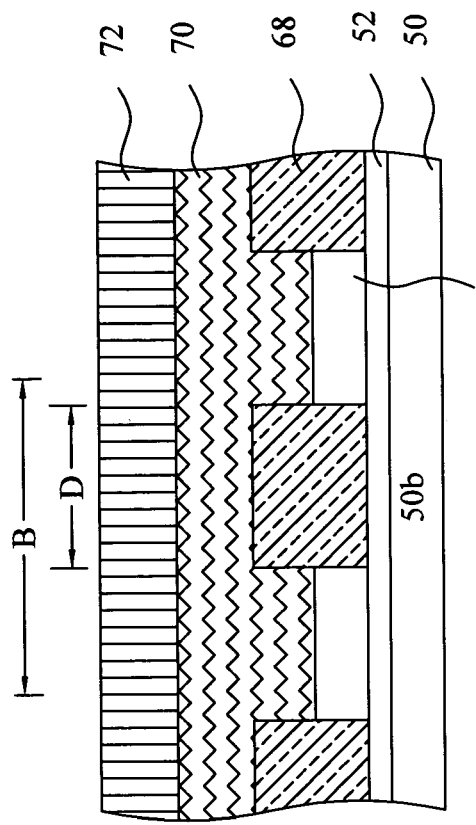
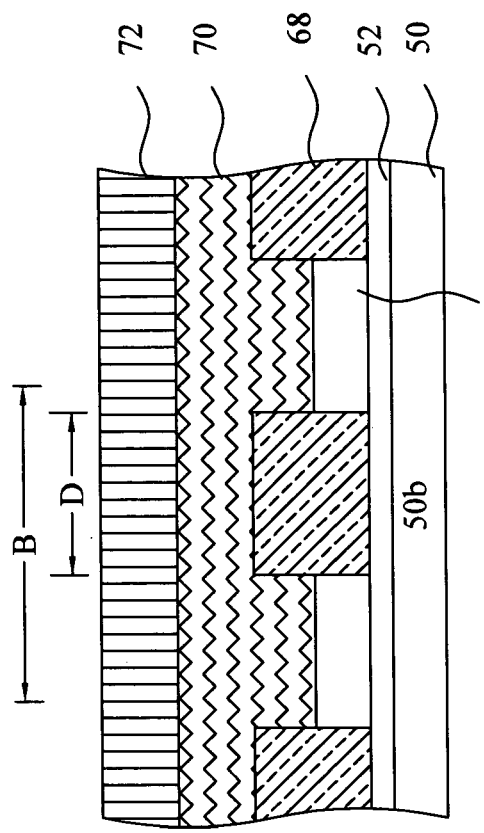
Fig. 2G
Fig. 2H

METHOD FOR DEFINING A MINIMUM PITCH IN AN INTEGRATED CIRCUIT BEYOND PHOTOLITHOGRAPHIC RESOLUTION

FIELD OF THE INVENTION

The present invention relates generally to the manufacture of an integrated circuit (IC) and more particularly, to a method for defining a minimum pitch in an integrated circuit beyond photolithographic resolution.

BACKGROUND OF THE INVENTION

Generally, the growth of integrated circuit industry depends on the continuous advancement in photolithographic technologies in integrated circuit manufacture. Propelled by advancement of photolithographic technologies, integrated circuits have repeatedly achieving the targets of higher density and smaller size. Hence, critical dimension (CD), including both minimum line width and space, of integrated circuits also has become finer and finer, indicating that higher resolutions are required. However, photolithographic resolution is fundamentally restricted by the wavelength of light sources used. To overcome such restriction, numerous methods provided by prior arts are available.

Referring to U.S. Pat. No. 5,618,383 issued to John N. Randall disclosing a low-temperature process for forming narrow lateral dimensioned microelectronic structures, this art comprises the steps of depositing and patterning an uncured photoresist on a supporting layer, at a low temperature using an anisotropic manufacturing process, depositing a conformal layer on sidewalls and on surfaces of the uncured photoresist with the conformal layer having substantial etch selectivity with respect to the photoresist, low-temperature anisotropic etching to remove the conformal layer from the surfaces of the uncured photoresist without substantially etching the conformal layer from vertical sidewalls, selectively removing the uncured photoresist to leave the isolated conformal layer, spin-coating of photoresist onto the isolated conformal layer and etching back to stop at the conformal layer, selectively etching to remove the conformal layer for forming an opening having a width as that of the conformal layer, and depositing a conductor to the opening, removing excessive conductor and photoresist for producing a narrow lateral dimensioned structure. However, structures formed using this method are prone to drawbacks as having relatively insufficient adherence.

Referring to U.S. Pat. No. 5,328,810 issued to Tyler A. Lowrey disclosing a method for reducing, by a factor of $2^N$, the minimum masking pitch of a photolithographic process, this art utilizes a conventional exposure and developing method for producing pattern of minimum line width F formable by photolithographic process onto a hard buffer layer, with the steps of reducing the line width of the hard buffer layer from F to F/2 by direct or indirect manner, depositing a second hard buffer layer having a relatively higher selective etch ratio to that of the hard buffer layer and underlayers, anisotropically etching to remove the second hard buffer layer on the top surfaces of the first hard buffer layer to leave the second hard buffer layer on the sidewalls of the first hard buffer layer, adopting the left sidewall second hard buffer layer as etch mask to reduce the pitch to ½ of the original pitch of mask pattern for that a width of the sidewall second hard buffer layer being F/4 at this point. The foregoing steps are repeated, and the minimum masking pitch of a photolithographic process is reduced by a factor of $2^N$. To be more precise, this method reduces a pitch by repeated deposition of conformal layers and anisotropic etching of hard buffer layers. However, this art has a drawback as the hard buffer layer being not so easily deposited.

Therefore, it is desired an improved method for defining a minimum pitch in an integrated circuit beyond photolithographic resolution.

SUMMARY OF THE INVENTION

One object of the present invention is to provide a method for defining a minimum pitch in an integrated circuit beyond photolithographic resolution, so as to resolve difficulties as photolithographic resolution being restricted by the wavelength of light source used.

In an embodiment according to the present invention, a method for defining a minimum pitch in an integrated circuit beyond photolithographic resolution comprises deposition of an insulating layer and a polysilicon onto a substrate already defined with a memory array region and a periphery region, formation of photoresist pattern on the polysilicon with the memory array region and periphery region to have different pitches, formation of polymer spacer to the photoresist pattern, etching the polysilicon to form trenches with the photoresist pattern and polymer spacer as mask, filling a photo-insensitive polymer into the trenches, removing the photoresist pattern over the memory array region, formation of polymer mask with which as mask to etch the polysilicon in the memory array region, and removing all the polymers, and as a result, it is obtained a final polysilicon pitch beyond photolithographic resolution.

In another embodiment according to the present invention, a method for defining a minimum pitch in an integrated circuit beyond photolithographic resolution comprises the steps of deposition of an insulator, a polysilicon and a buffer layer onto a substrate already defined with a memory array region and a periphery region, formation of a photoresist pattern on the buffer layer with the memory array region and periphery region to have different pitches, formation of polymer spacers to the photoresist pattern, etching the buffer layer and polysilicon with the photoresist pattern and polymer spacers as mask to form trenches, filling the trenches with a photo-insensitive polymer, etching back to the buffer layer, removing the buffer layer, forming a polymer mask over the memory array region with which as mask to etch the polysilicon, and removing all the polymers, and as a result, it is obtained a final polysilicon pitch beyond photolithographic resolution.

Furthermore, in this method, the minimum polysilicon pitch in the memory array region on photomask is enlarged and the initial minimum polysilicon pitch in the periphery region on photomask can be reduced. It helps overcoming the difficulty of a significant difference in polysilicon pitch between the memory array region and periphery region in conventional approaches.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIGS. 2A to 2I are schematic views showing a second embodiment according to the present invention.

DETAILED DESCRIPTION OF THE INVENTION

First Embodiment

Figure 1A:
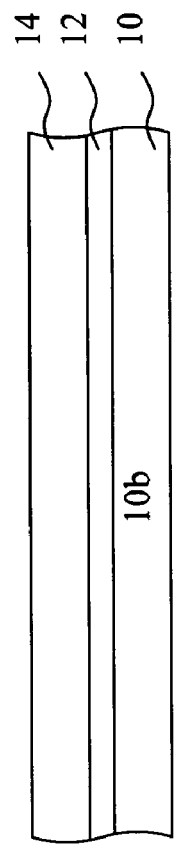
FIGS. 1A to 1I are schematic views showing a first embodiment according to the present invention.
Figure 1A:
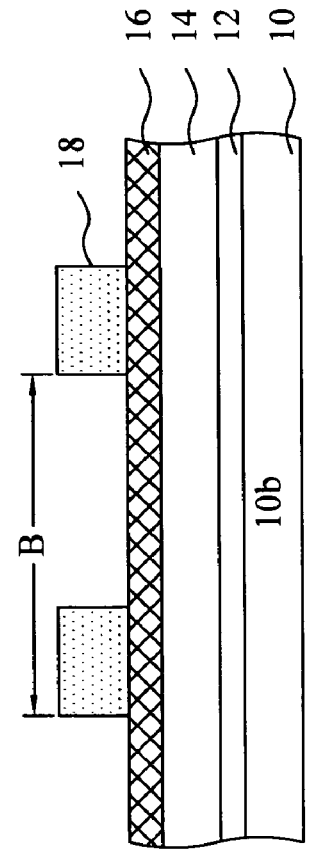
Figure 1B:
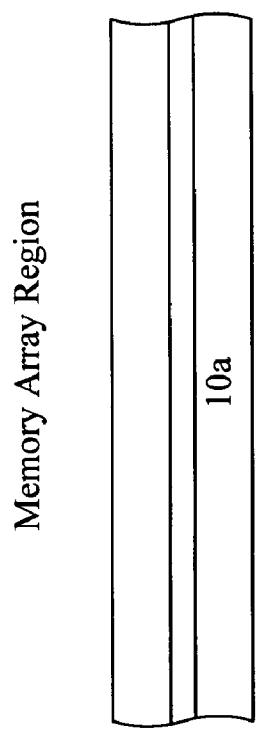
Figure 1B:
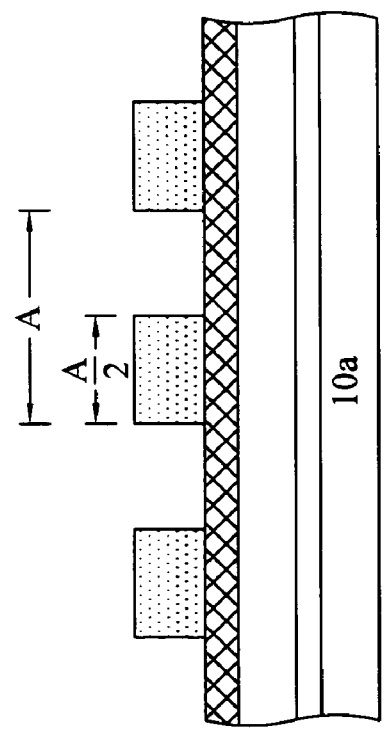

FIGS. 1A–1I show a first embodiment according to the present invention. Referring to FIG. 1A, an oxide 12 and a polysilicon 14 are deposited on a substrate 10 on which a memory array region 10a and a periphery region 10b are defined. The polysilicon 14 is the target layer that will be formed with pitches beyond photolithographic resolution in the following process. An anti-reflection coating (ARC) 16 and a photoresist 18 are applied on the polysilicon 14, and a photoresist pattern 18 is defined to the photoresist 18 after exposure and development. The minimum pitch in the memory array region 10a is A and the minimum pitch in the periphery region 10b is B. Pitch is defined as the sum of a line width and a line space, and preferably, both the line width and the space in the memory array region are A/2, as shown in FIG. 1B.

Figure 1C:
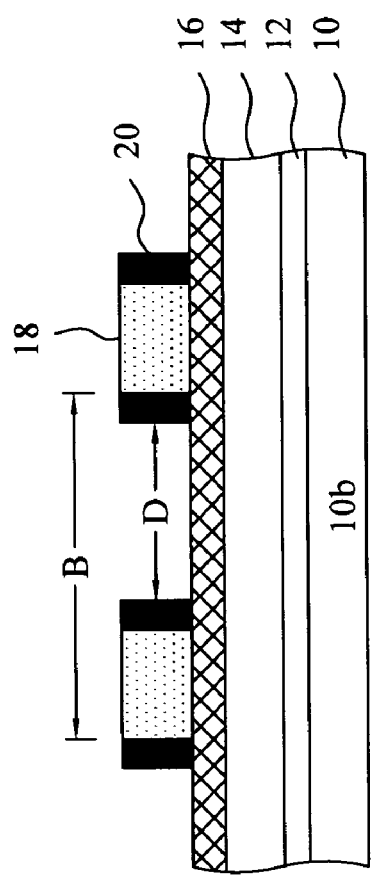
Figure 1C:
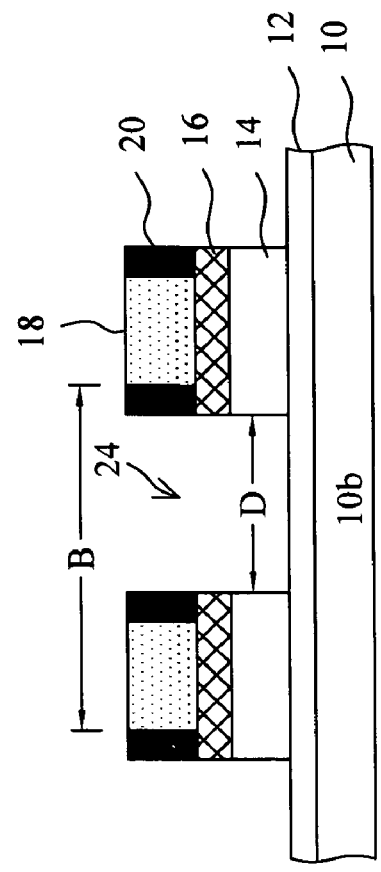
Figure 1D:
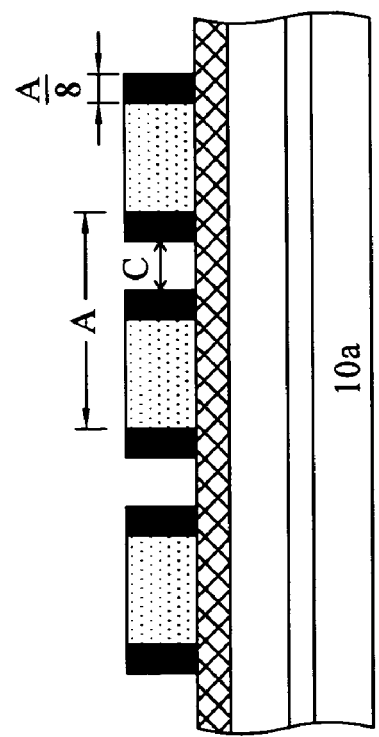
Figure 1D:
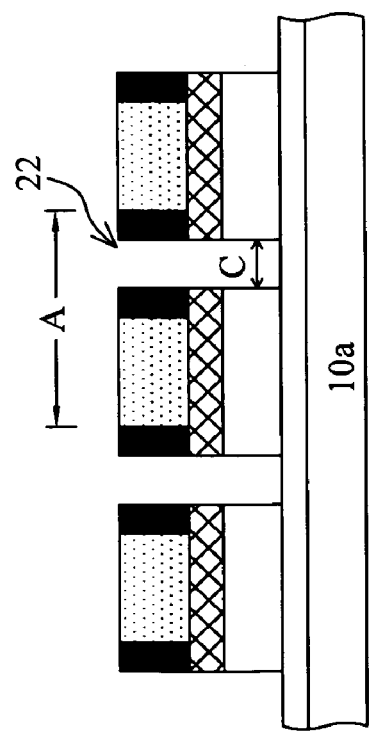
Figure 1E:
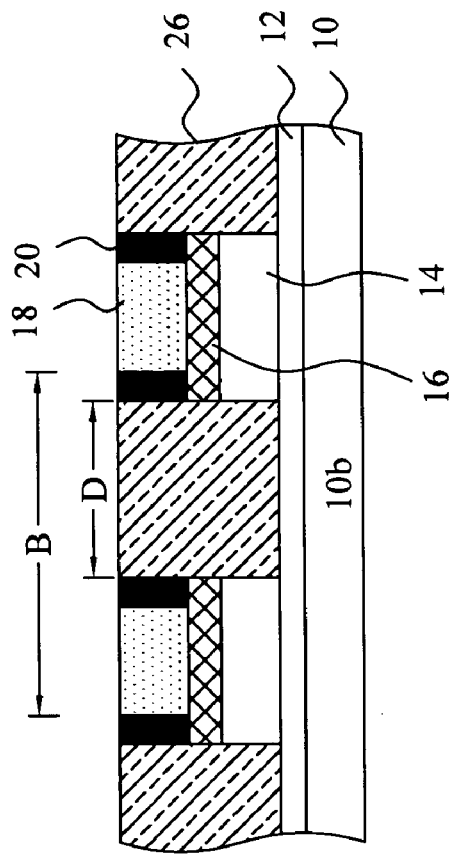
Figure 1F:
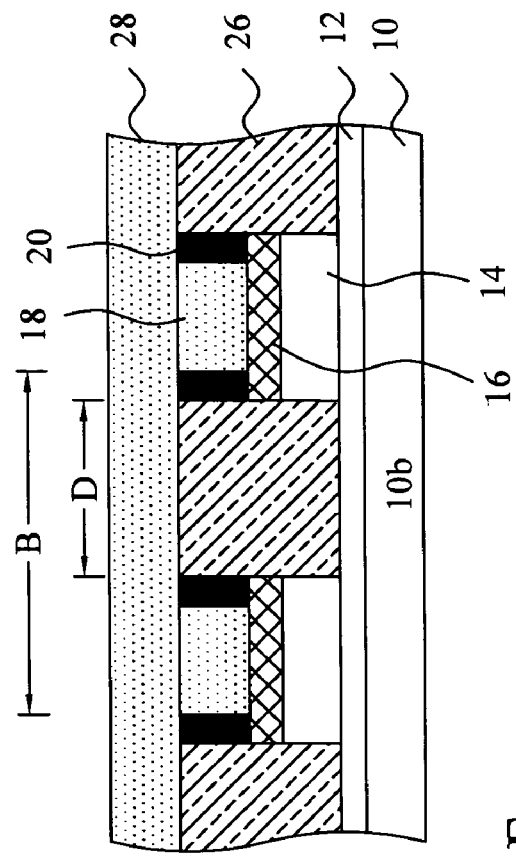

Referring to FIG. 1C, polymer spacers 20 are formed on each sidewall of the photoresist pattern 18. This polymer 20 is deposited only on the sidewalls of the photoresist pattern 18. If the polymer 20 is also deposited on the top surface of the photoresist pattern 18, an etching back is further performed to remove the top portion. Preferably, the space C between the polymer spacers 20 in the memory array region 10a is A/4. At the same time, the space in the periphery region 10b becomes D. Using the photoresist pattern 18 and the polymer spacers 20 as a mask to etch the polysilicon 14 and ARC 16, trenches 22 having a width C are formed in the memory array region 10a. As described above, C=A/4, and the trenches 24 formed at the periphery region 10b have a width of D, as shown in FIG. 1D. A photo-insensitive polymer 26 is then filled in the trenches 22 and 24 and etched back, as shown in FIG. 1E. Another photoresist 28 is coated. Exposure and development are performed to the memory array region 10a, and only the photoresist 28 in the periphery region 10b remains, as shown in FIG. 1F.

Figure 1G:
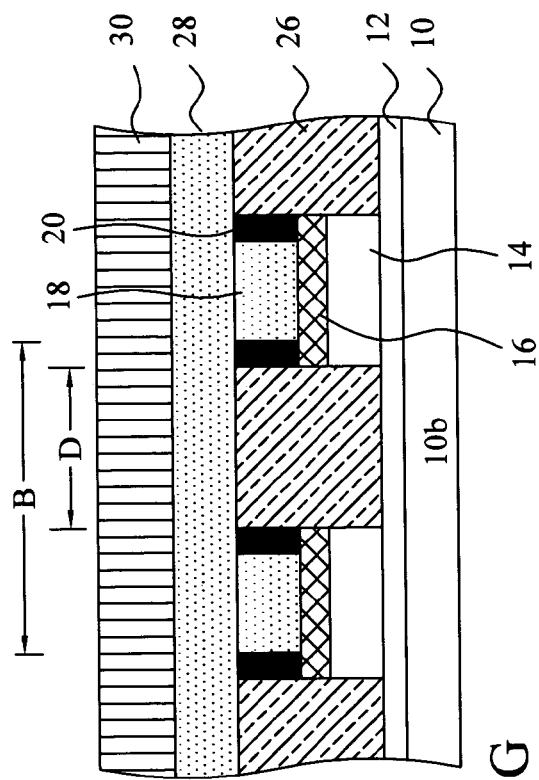
Figure 1H:
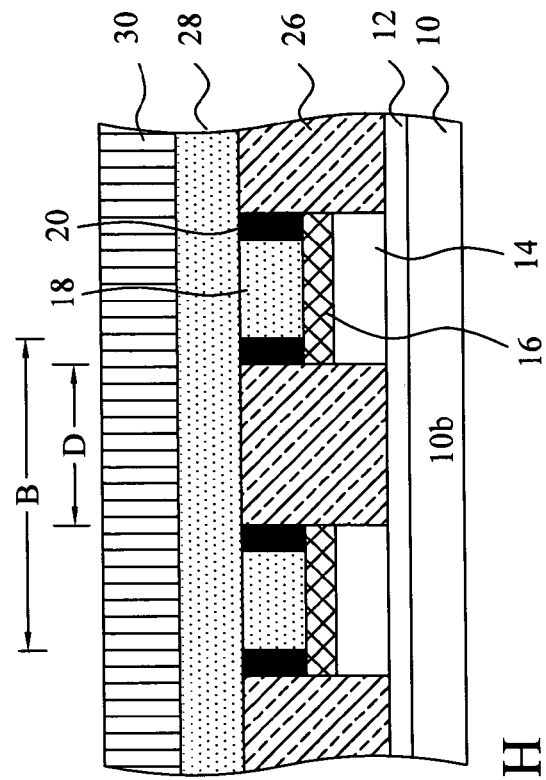
Figure 1I:
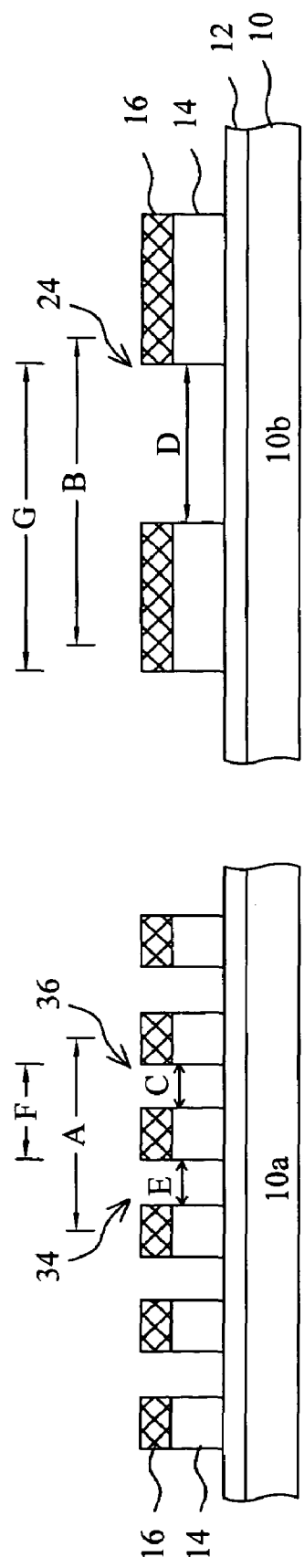

Using, for example, chemical vapor deposition (CVD), polymer masks 30 and 32 are formed in the periphery region 10b and memory array region 10a, respectively. The polymer mask 32 in the memory array region 10a has a space of E, and preferably, E=C=A/4, as shown in FIG. 1G. With the polymer mask 32, the ARC 16 and polysilicon 14 in the memory array region 10a are etched to form trenches 34 having a width of E, as shown in FIG. 1H. Referring to FIG. 1I, the polymer masks 30 and 32, photoresist 28 and 18, polymer spacers 20 and photo-insensitive polymer 26 are removed. In the memory array region 10a, the spaces 34 and 36 are E and C, respectively, and equal to A/4, with a final pitch F equal to A/2. In other words, the final pitch F is reduced to a half of the initial pitch A of the photoresist pattern 18 shown in FIG. 1B. In the periphery region 10b, the final pitch G is the same as the initial pitch B of the photoresist pattern 18 shown in FIG. 1B.

Second Embodiment

Figure 2A:
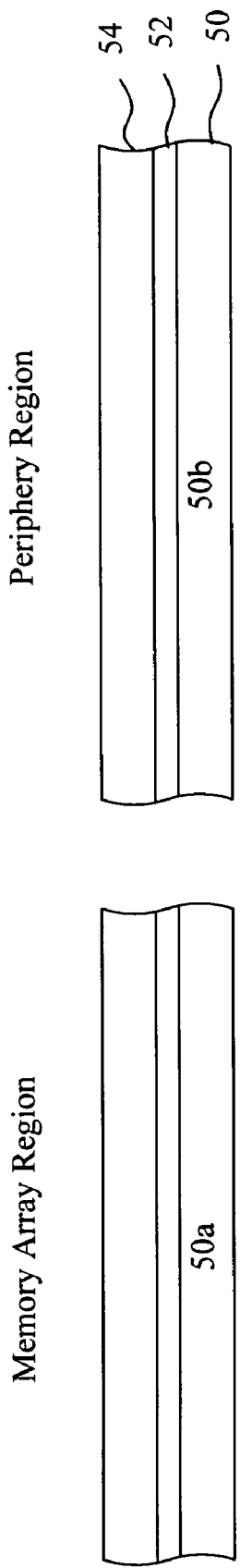
Figure 2B:
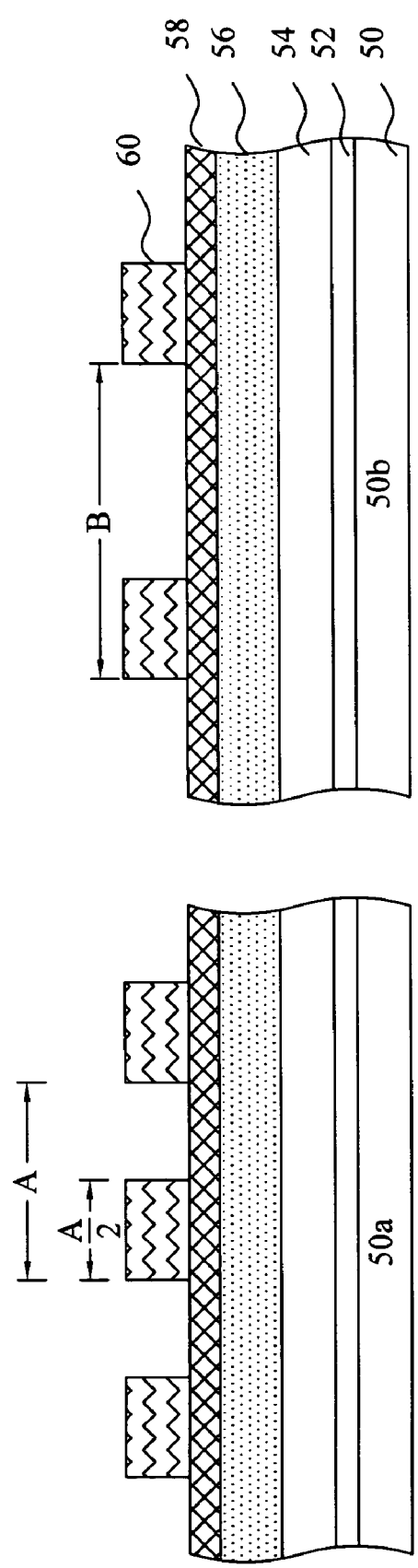

FIGS. 2A–2I show another embodiment according to the present invention. An oxide 52 and a polysilicon 54 are deposited onto a substrate 50, on which a memory array region 50a and a periphery region 50b are to be defined, and the polysilicon 54 in the memory array region 50a is the target layer to have the pitch beyond photolithographic resolution. Referring to FIG. 2B, a buffer layer 56, for example, oxide or silicon nitride of sufficiently high etch selectivity with respect to polysilicon 54 is further deposited. An ARC 58 and a photoresist 60 are applied thereon, and a photoresist pattern 60 is defined by exposure and development processes. The minimum pitch in the memory array region 50a is referred to as A, and the minimum pitch in the periphery region 50b is referred to as B. Preferably, a line width and a line space of the pitch A are both A/2.

Figure 2C:
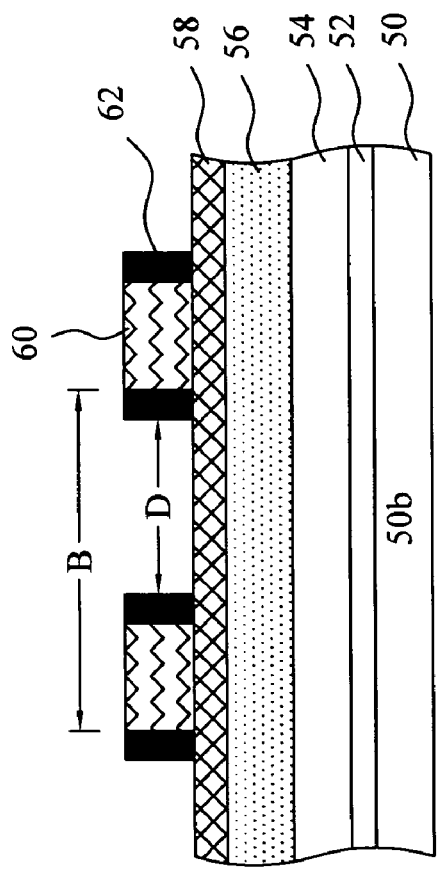
Figure 2C:
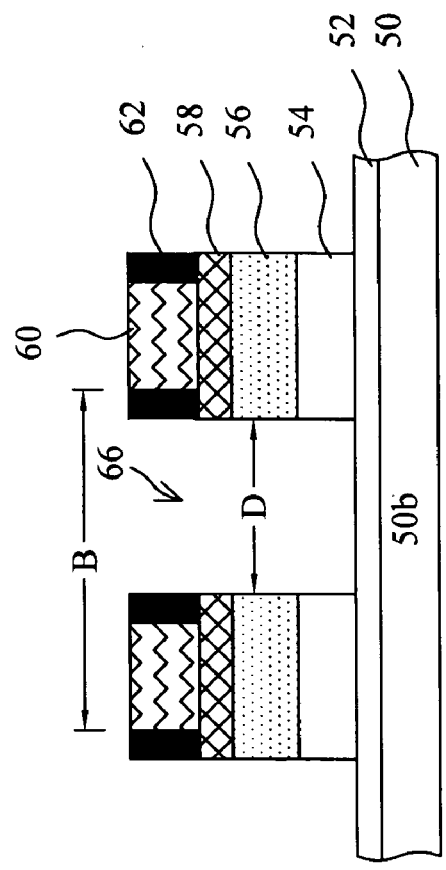
Figure 2D:
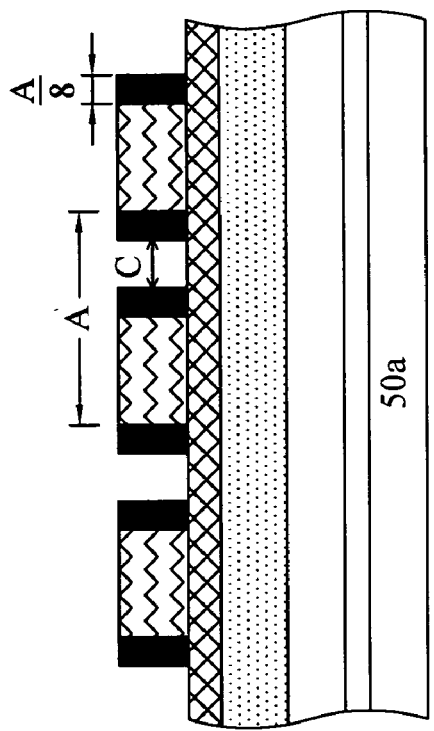
Figure 2D:
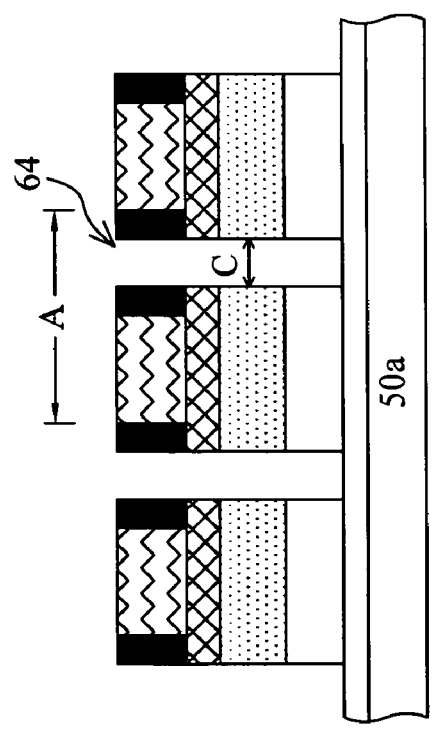
Figure 2E:
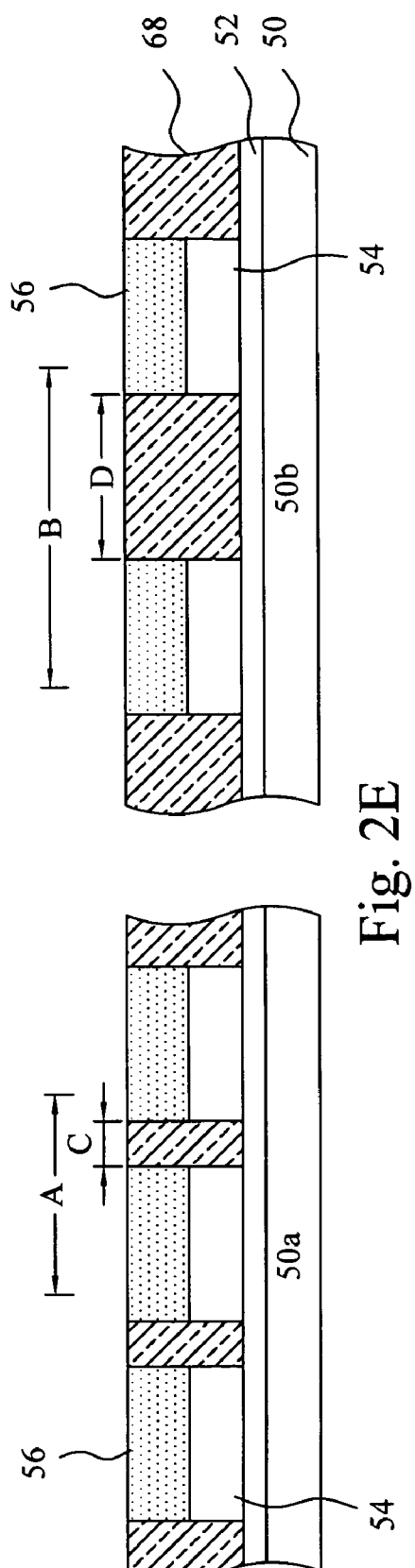

Referring to FIG. 2C, polymer spacers 62 are formed on the sidewalls of the photoresist pattern 60. Preferably, the width of polymer spacers 62 is A/8, such that each space C between the polymer spacers 62 in the memory array region 50a is A/4. Meanwhile, each space in the periphery region 10b is D. The ARC 58, buffer layer 56 and polysilicon 54 are etched with the photoresist pattern 60 and polymer spacers 62 as etch mask, to form trenches 64, each of which having a width of C, in the memory array region 50a and to form trenches 66, having a width of D, in the periphery region 10b, as shown in FIG. 2D.

Figure 2F:
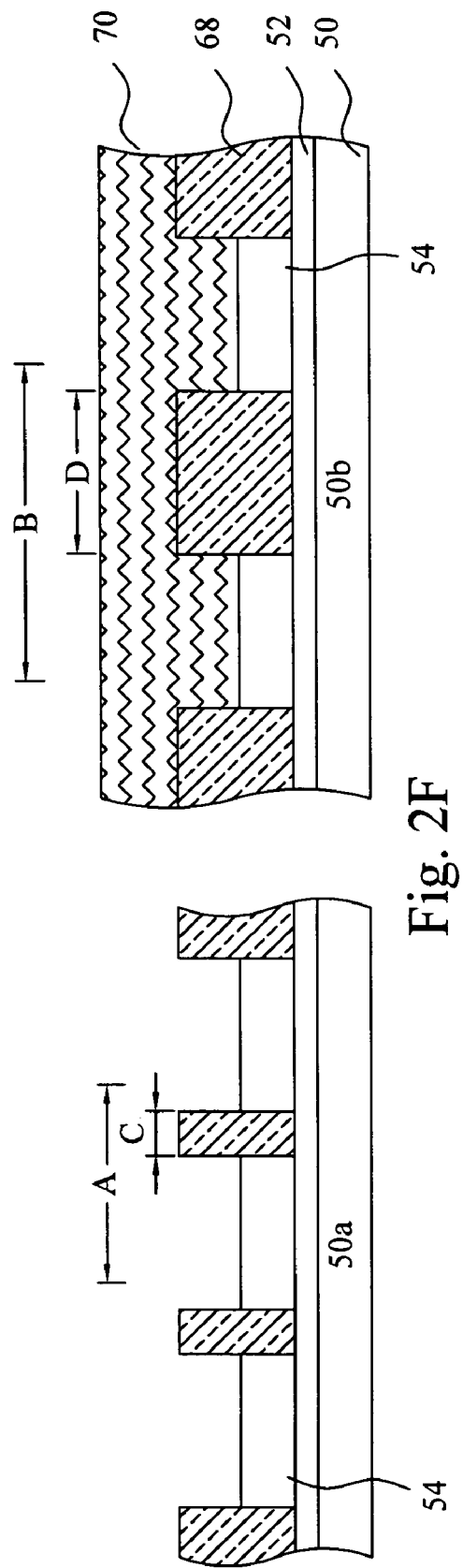

The polymer spacer 62 can be optionally removed. A photo-insensitive polymer 68 fills trenches 64 and 66. It is then etched back thereto to stop at the buffer layer 56, and in this etching back process, over etching is allowed to the buffer layer 56, Referring to FIG. 2E. Buffer layer 56 is then removed and a photoresist 70 is coated. Exposure and development are performed to the memory array region 50a, and only the photoresist 70 in the periphery region 50b remains, as shown in FIG. 2F.

Figure 2I:
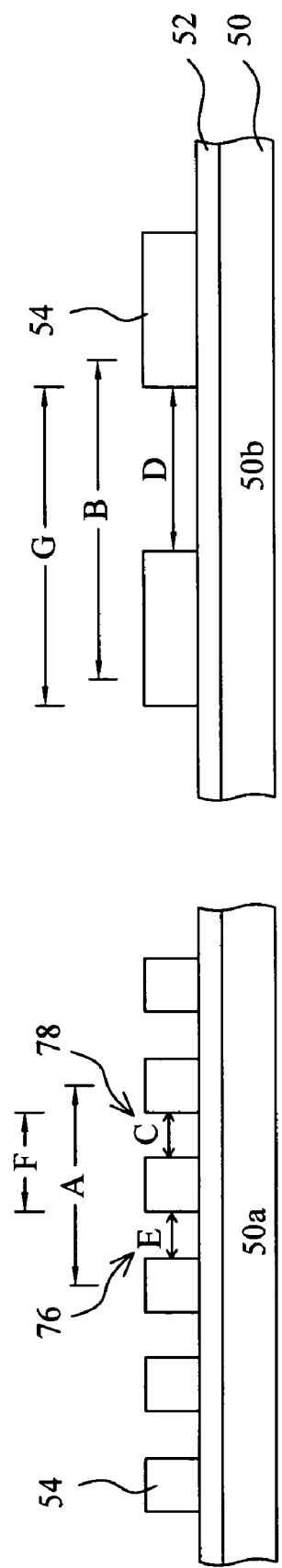

Using for example CVD, polymer masks 72 and 74 are deposited in the memory array region 50a and periphery region 50b, respectively. The polymer mask 74 in the memory array region 50a has spaces E, and preferably, E=C=A/4, as shown in FIG. 2G. With the polymer mask 74, polysilicon 54 in the memory array region 50a is etched to form trenches 76, each of which having a width of E, as shown in FIG. 2H. Referring to FIG. 2I, polymer masks 72 and 74, photoresist 70 and photo-insensitive polymer 68 are all removed. In the memory array region 50a, spaces 76 and 78 are E=C=A/4, with a final pitch of F=A/2. That is, the final pitch F is reduced to a half of the initial pitch A of the photoresist pattern 60 shown in FIG. 2B. On the other hand, in the periphery region 50b, the final pitch G is the same as the initial pitch B of the photoresist pattern 60 shown in FIG. 2B.

The ARC layers 16 and 58 may be organic before or after coating the photoresist. Organic ARC material if spun-on before coating the photoresist, has the advantage of being simultaneously removed with the photoresist. In addition, the purpose of polymer spacers 20 and 62 are used to reduce the spaces C in the photoresist pattern 18 and 60.

Embodiments of the invention realize the final pitch F of the polysilicon in the memory array region being a half of the initial pitch A of the photoresist pattern. In the two embodiments, when the initial pitch A is less than 2 times of the photolithographic resolution, then the final pitch F, equal to A/2, will be less than photolithographic resolution. In addition, the initial polysilicon pitch in the memory array region in this invention is twice as much as it is in the conventional approach. As a result, the difference in polysilicon pitch in the memory array region and peripheral region is thus minimized. Therefore, this invention provides a method which overcomes the difficulty, encountered in the conventional approach, of a significant difference in the polysilicon pitch in the memory array region and periphery region.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for defining a minimum pitch in an integrated circuit beyond photolithographic resolution, comprising the steps of:
    forming a target layer to be defined with said minimum pitch thereof;
    forming a patterned layer including a pitch on said target layer;
    forming a first sidewall spacer onto said patterned layer;
    etching said target layer for forming a first trench;
    filling an insulator in said first trench;
    removing said patterned layer;
    forming a second sidewall spacer onto said first sidewall spacer;
    etching said target layer for forming a second trench; and
    removing said insulator, first and second sidewall spacers.

2. A method according to claim 1, wherein said step of forming a target layer comprises the steps of:
    forming an oxide on a substrate; and
    depositing a polysilicon as said target layer on said oxide.

3. A method according to claim 2, further comprising the step of depositing an ARC on said polysilicon.

4. A method according to claim 3, wherein said ARC comprises an organic material.

5. A method according to claim 1, wherein said step of forming a patterned layer comprises the steps of:
    coating a photoresist on said target layer; and
    exposing and developing said photoresist for being said patterned layer.

6. A method according to claim 5, further comprising the step of depositing an ARC on said photoresist.

7. A method according to claim 6, wherein said ARC comprises an organic material.

8. A method according to claim 1, wherein said pitch reaches or approaches a minimum resolution of a photolithographic process of forming said patterned layer.

9. A method according to claim 1, wherein said step of forming a first sidewall spacer comprises the steps of:
    depositing a polymer on a top surface and sidewall of said patterned layer; and
    etching-back said polymer for leaving a portion thereof on said sidewall of said patterned layer.

10. A method according to claim 1, wherein said first trench comprises a width substantially equal to ¼ of a width of said pitch.

11. A method according to claim 1, wherein said first sidewall spacer comprises a width substantially equal to ⅛ of a width of said pitch.

12. A method according to claim 1, wherein said step of etching said target layer for forming a first trench comprises a plasma etching with said patterned layer and first sidewall spacer as a mask.

13. A method according to claim 1, wherein said step of filling an insulator in said first trench comprises the steps of:
    forming a polymer filled in said first trench; and
    etching-back said polymer for leaving a portion thereof in said first trench.

14. A method according to claim 13, wherein said polymer comprises a photo-insensitive material.

15. A method according to claim 1, wherein said step of forming a second sidewall spacer comprises the step of forming a polymer on said insulator and a top surface and sidewall of said first sidewall spacer.

16. A method according to claim 15, wherein said polymer is serving as a mask in said step of etching said target layer for forming a second trench.

17. A method according to claim 1, wherein said second trench comprises a width substantially equal to ¼ of a width of said pitch.

18. A method according to claim 1, wherein said second sidewall spacer comprises a width substantially equal to ⅛ of a width of said pitch.

19. A method for defining a minimum pitch in an integrated circuit beyond photolithographic resolution, comprising the steps of:
    forming a target layer to be defined with said minimum pitch thereof;
    forming a buffer layer on said target layer;
    forming a patterned layer including a pitch on said buffer layer;
    forming a first sidewall spacer onto said patterned layer;
    etching said buffer and target layers for forming a first trench;
    filling an insulator in said first trench;
    removing the materials on a top surface of said target layer;
    forming a second sidewall spacer onto said insulator;
    etching said target layer for forming a second trench; and
    removing said insulator and second sidewall spacer.

20. A method according to claim 19, wherein said step of forming a target layer comprises the steps of:
    forming an oxide on a substrate; and
    depositing a polysilicon as said target layer on said oxide.

21. A method according to claim 19, wherein said buffer layer comprises a higher etching rate than that of said target layer.

22. A method according to claim 19, wherein said buffer layer comprises an oxide or silicon nitride.

23. A method according to claim 19, further comprising the step of depositing an ARC on said buffer layer.

24. A method according to claim 23, wherein said ARC comprises an organic material.

25. A method according to claim 19, wherein said step of forming a patterned layer comprises the steps of:
    coating a photoresist on said buffer layer; and
    exposing and developing said photoresist for being said patterned layer.

26. A method according to claim 25, further comprising the step of depositing an ARC on said photoresist.

27. A method according to claim 26, wherein said ARC comprises an organic material.

28. A method according to claim 19, wherein said pitch reaches or approaches a minimum resolution of a photolithographic process of forming said patterned layer.

29. A method according to claim 19, wherein said step of forming a first sidewall spacer comprises the steps of:
    depositing a polymer on a top surface and sidewall of said patterned layer; and
    etching-back said polymer for leaving a portion thereof on said sidewall of said patterned layer.

30. A method according to claim 19, wherein said first trench comprises a width substantially equal to ¼ of a width of said pitch.

31. A method according to claim 19, wherein said first sidewall spacer comprises a width substantially equal to ⅛ of a width of said pitch.

32. A method according to claim 19, wherein said step of etching said buffer and target layers for forming a first trench comprises a plasma etching with said patterned layer and first sidewall spacer as a mask.

33. A method according to claim 19, wherein said step of filling an insulator in said first trench comprises the step of forming a polymer filled in said first trench.

34. A method according to claim 33, further comprising the step of removing said first sidewall spacer before said step of forming a polymer.

35. A method according to claim 33, wherein said polymer comprises a photo-insensitive material.

36. A method according to claim 19, wherein said step of removing the materials on a top surface of said target layer comprises the steps of:
   etching-back to a thickness of said buffer layer; and
   removing said buffer layer.

37. A method according to claim 19, wherein said step of forming a second sidewall spacer comprises the step of forming a polymer on a top surface and sidewall of said insulator.

38. A method according to claim 37, wherein said polymer is serving as a mask in said step of etching said target layer for forming a second trench.

39. A method according to claim 19, wherein said second trench comprises a width substantially equal to ¼ of a width of said pitch.

40. A method according to claim 19, wherein said second sidewall spacer comprises a width substantially equal to ⅛ of a width of said pitch.

41. A method for defining a minimum pitch in an integrated circuit beyond photolithographic resolution, comprising the steps of:
   defining a first and second regions on a substrate;
   forming an insulator on said substrate;
   depositing a conductor on said insulator;
   coating a first photoresist on said conductor;
   exposing and developing said first photoresist for forming a pattern thereof, said pattern having a first and second pitches in said first and second regions, respectively, with said second pitch larger than said first pitch;
   forming a polymer spacer on a sidewall of said first photoresist;
   etching said conductor with said first photoresist and polymer spacer as a mask for forming a first and second trenches thereof in said first and second regions, respectively;
   forming a photo-insensitive polymer filled in said first and second trenches;
   coating a second photoresist in said second region and removing said first photoresist from said first region;
   forming a polymer mask on said photo-insensitive polymer and a top surface and sidewall of said polymer spacer in said first region;
   etching said conductor with said polymer spacer as a mask for forming a third trench thereof; and
   removing said polymer mask, second photoresist, polymer spacer and photo-insensitive polymer.

42. A method according to claim 41, wherein said first and second regions comprises a memory array region and a periphery region, respectively.

43. A method according to claim 41, wherein said step of depositing a conductor on said insulator comprises the step of depositing a polysilicon.

44. A method according to claim 41, further comprising the step of depositing an ARC before said step of coating a first photoresist on said conductor.

45. A method according to claim 44, wherein said ARC comprises an organic material.

46. A method according to claim 41, further comprising the step of depositing an ARC before said step of exposing and developing said first photoresist for forming a pattern thereof.

47. A method according to claim 46, wherein said ARC comprises an organic material.

48. A method according to claim 41, wherein said first pitch reaches or approaches a minimum resolution of a photolithographic process of forming said patterned layer.

49. A method according to claim 41, wherein said first trench comprises a width substantially equal to ¼ of said first pitch.

50. A method according to claim 41, wherein said step of forming a photo-insensitive polymer filled in said first and second trenches comprises the step of etching back said photo-insensitive polymer to a top surface of said first photoresist.

51. A method according to claim 41, wherein said third trench comprises a width substantially equal to ¼ of said first pitch.

52. A method for defining a minimum pitch in an integrated circuit beyond photolithographic resolution, comprising the steps of:
   defining a first and second regions on a substrate;
   forming an insulator on said substrate;
   depositing a conductor on said insulator;
   forming a buffer layer on said conductor;
   coating a first photoresist on said buffer layer;
   exposing and developing said first photoresist for forming a pattern thereof, said pattern having a first and second pitches in said first and second regions, respectively, with said second pitch larger than said first pitch;
   forming a polymer spacer on a sidewall of said first photoresist;
   etching said buffer layer and conductor with said first photoresist and polymer spacer as a mask for forming a first and second trenches thereof in said first and second regions, respectively;
   forming a photo-insensitive polymer filled in said first and second trenches;
   etching back to a thickness of said buffer layer left;
   removing said buffer layer;
   forming a polymer mask on a top surface and sidewall of said photo-insensitive polymer in said first region;
   etching said conductor with said polymer spacer as a mask for forming a third trench thereof; and
   removing said polymer mask and photo-insensitive polymer.

53. A method according to claim 52, wherein said first and second regions comprises a memory array region and a periphery region, respectively.

54. A method according to claim 52, wherein said step of depositing a conductor on said insulator comprises the step of depositing a polysilicon.

55. A method according to claim 52, further comprising the step of depositing an ARC before said step of coating a first photoresist on said buffer layer.

56. A method according to claim 55, wherein said ARC comprises an organic material.

57. A method according to claim 52, further comprising the step of depositing an ARC before said step of exposing and developing said first photoresist for forming a pattern thereof.

58. A method according to claim 57, wherein said ARC comprises an organic material.

59. A method according to claim 52, wherein said first pitch reaches or approaches a minimum resolution of a photolithographic process of forming said patterned layer.

60. A method according to claim 52, wherein said first trench comprises a width substantially equal to ¼ of said first pitch.

61. A method according to claim 52, further comprising the step of removing said polymer spacer before said step of forming a photo-insensitive polymer filled in said first and second trenches.

62. A method according to claim 52, further comprising the step of forming a passivation covered over said second region before said step of forming a polymer mask.

63. A method according to claim 52, wherein said third trench comprises a width substantially equal to ¼ of said first pitch.

* * * * *